US010290822B2

(12) United States Patent
Fong et al.

(10) Patent No.: US 10,290,822 B2
(45) Date of Patent: May 14, 2019

(54) THIN FILM TRANSISTOR INCLUDING RECESSED GATE INSULATION LAYER AND ITS MANUFACTURING METHOD, ARRAY SUBSTRATE, AND DISPLAY DEVICE

(71) Applicant: BOE TECHNOLOGY GROUP CO., LTD., Beijing (CN)

(72) Inventors: Honhang Fong, Beijing (CN); Yingtao Xie, Beijing (CN); Shihong Ouyang, Beijing (CN); Shucheng Cai, Beijing (CN); Qiang Shi, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/769,670

(22) PCT Filed: Nov. 7, 2014

(86) PCT No.: PCT/CN2014/090623
§ 371 (c)(1),
(2) Date: Aug. 21, 2015

(87) PCT Pub. No.: WO2016/011727
PCT Pub. Date: Jan. 28, 2016

(65) Prior Publication Data
US 2016/0276606 A1 Sep. 22, 2016

(30) Foreign Application Priority Data
Jul. 25, 2014 (CN) .......................... 2014 1 0360841

(51) Int. Cl.
*H01L 29/08* (2006.01)
*H01L 51/05* (2006.01)
(Continued)

(52) U.S. Cl.
CPC .......... *H01L 51/0516* (2013.01); *H01L 27/12* (2013.01); *H01L 27/283* (2013.01);
(Continued)

(58) Field of Classification Search
CPC . H01L 51/0516; H01L 51/052; H01L 51/105; H01L 27/12; H01L 27/283; H01L 29/66969; H01L 29/786; H01L 29/7869
See application file for complete search history.

(56) References Cited

U.S. PATENT DOCUMENTS

2006/0284181 A1* 12/2006 Chae .................... H01L 29/0673
257/66
2008/0001142 A1* 1/2008 Cho .................... H01L 51/0545
257/40

(Continued)

FOREIGN PATENT DOCUMENTS

CN 103165471 A 6/2013
CN 203824862 A 5/2014

OTHER PUBLICATIONS

First Chinese Office Action dated Jun. 27, 2016; Appln. No. 201410360841.3.
(Continued)

Primary Examiner — Matthew E. Gordon
(74) Attorney, Agent, or Firm — Ladas & Parry LLP; Loren K. Thompson

(57) ABSTRACT

A thin film transistor and its manufacturing method, an array substrate and a display device are disclosed, the thin film transistor is of a gate bottom contact type, and includes a gate electrode (3) and a gate insulation layer (2), the gate insulation layer (2) is provided with a recess (4) at a position corresponding to the gate electrode (3). With the thin film transistor, the problem of wire breakage in the active layer at the channel between the source/drain electrodes can be avoided, the performance and stability of the thin film
(Continued)

transistor is improved, and the production cost is lowered down.

20 Claims, 3 Drawing Sheets

(51) Int. Cl.
    *H01L 29/786*     (2006.01)
    *H01L 27/12*     (2006.01)
    *H01L 27/28*     (2006.01)
    *H01L 29/66*     (2006.01)
    *H01L 51/10*     (2006.01)

(52) U.S. Cl.
    CPC ...... *H01L 29/66969* (2013.01); *H01L 29/786* (2013.01); *H01L 29/7869* (2013.01); *H01L 51/052* (2013.01); *H01L 51/0545* (2013.01); *H01L 51/102* (2013.01); *H01L 51/105* (2013.01)

(56) References Cited

U.S. PATENT DOCUMENTS

| | | | | |
|---|---|---|---|---|
| 2011/0204334 A1* | 8/2011 | Kim | ...................... | H01L 51/105 257/40 |
| 2013/0009161 A1* | 1/2013 | Himori | ............... | H01L 51/0558 257/60 |
| 2013/0285054 A1* | 10/2013 | Moriguchi | .......... | H01L 27/1225 257/43 |
| 2014/0014934 A1* | 1/2014 | Ukeda | ................. | H01L 51/0545 257/40 |
| 2015/0102338 A1 | 4/2015 | Kong et al. | | |
| 2016/0341997 A1* | 11/2016 | Fukushima | ........... | H01L 51/105 |

OTHER PUBLICATIONS

International Search Report & Written Opinion of the International Searching Authority Appln. No. PCT/CN2014/0900623; dated Apr. 24, 2015.

Second Chinese Office Action dated Nov. 22, 2016; Appln No. 201410360841.3.

* cited by examiner

THIN FILM TRANSISTOR INCLUDING RECESSED GATE INSULATION LAYER AND ITS MANUFACTURING METHOD, ARRAY SUBSTRATE, AND DISPLAY DEVICE

TECHNICAL FIELD

At least one embodiment of the present invention relates to a thin film transistor and its manufacturing method, an array substrate and a display device.

BACKGROUND

In the structure of a display panel including organic thin film transistor devices, an organic semiconductor layer on an array substrate is not formed on a fully flat plane, and is always formed on other layers with a step. The organic semiconductor layer is provided above or below and between a source electrode and a drain electrode, so as to ensure the source electrode and the drain electrode can be normally conducted upon being in on-state.

SUMMARY

At least one embodiment of the present invention provides a thin film transistor and its manufacturing method, an array substrate, and a display device, by which wire breakage in an active layer can be avoided, the performance and stability of the thin film transistor can be improved, and the production cost can be lowered down.

In the first aspect, at least one embodiment of the present invention provides a thin film transistor, the thin film transistor is a bottom gate type thin film transistor, and includes a gate electrode and a gate insulation layer, wherein the gate insulation layer is provided with a recess at a position corresponding to the gate electrode.

In the second aspect, at least one embodiment of the present invention provides an array substrate including the thin film transistor according to the first aspect.

In the third aspect, at least one embodiment of the present invention provides a display device including the array substrate according to the second aspect.

In the fourth aspect, at least one embodiment of the present invention provides a manufacturing method for a thin film transistor, the method includes forming a gate metal layer including a gate electrode, a gate line and a gate lead, and forming a gate insulation layer on the gate metal layer, wherein the gate insulation layer is provided with a recess at a position corresponding to the gate electrode.

DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

1—substrate; 2—gate insulation layer; 3—gate electrode; 4—recess on gate insulation layer; 5—source electrode; 6—drain electrode; 7—active layer

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless defined otherwise, the technical term or science term used herein should be the general meaning as understood by the person skilled in the art. The words "first", "second", and so on, as used herein, are not intended to indicate any sequence, number or importance, and are only used to distinguish one from the other. Likely, the word "a", "an", or "the" and the like, as used herein, is not intended to indicate any limitation on the number, and is only used to indicate at least one exist. The word "include", or "comprise", and so on, as used herein, means that a member or article preceded this word includes the members or articles listed behind this word and their equivalent, and does not exclude other members or articles. The word "connect" or "connected with" or the like is not limited to being physically connected, and may also include being electrically connected, whatever directly or indirectly. The words "above", "below", "left", "right", and so on are only used to indicate the relative positional relationship, and when the absolute position of the modified objects is changed, the relative positional relationship will also be changed accordingly.

The inventors of the present invention have noted that, because the pattern of a source electrode and a drain electrode and a gate insulation layer have a step therebetween and are not located at the same plane, when an organic semiconductor layer is formed, a semiconductor material behaviors differently when it is provided on the source/drain electrodes and the gate insulation layer, the thus formed film has different thickness, and the thickness of the film is difficulty to be controlled, which could easily cause wire breakage in the organic semiconductor layer, and even cause that the source/drain electrode can not be normally conducted.

Figure 1:
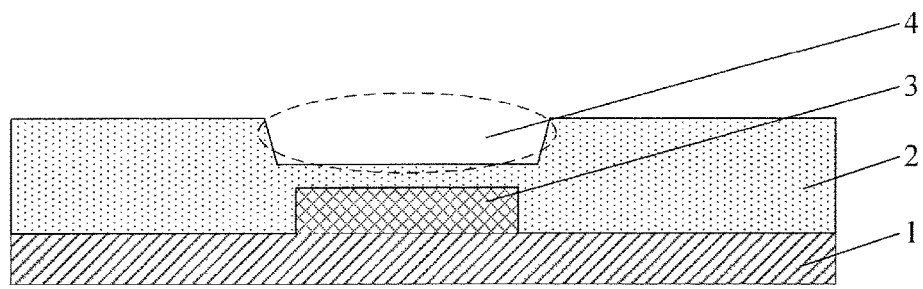
FIG. 1 is a schematic structure view showing a thin film transistor provided by an embodiment of the present invention.

At least one embodiment of the present invention provides a thin film transistor, the thin film transistor may be a gate bottom contact type thin film transistor, as shown in FIG. 1, the thin film transistor includes a substrate 1, a gate electrode 3 and a gate insulation layer 2; the gate insulation layer is provided with a recess 4 at a position corresponding to the gate electrode 3.

For example, the recess on the gate insulation layer at the position corresponding to the gate electrode can be formed by one patterning process with a mask plate and by exposure, development and etching, when the gate insulation layer is formed. For example, the substrate may be a glass substrate, a plastic substrate, or a substrate of stainless steel combined with an insulation film, or the like.

In the embodiment of the present invention, the gate insulation layer can be made of a photosensitive organic material, and the gate insulation layer may have a thickness ranged from 200 to 500 nm. The gate electrode can be formed of a metal, indium tin oxide (ITO) or an organic conductive material, and the gate electrode may have a thickness ranged from 60 to 300 nm.

In the thin film transistor provided by the embodiment of the present invention, by providing the recess at the position corresponding to the gate electrode on the gate insulation layer of the thin film transistor of the display device, an active layer can be provided at a position corresponding to the recess on the gate insulation layer, by which the active layer, the source electrode and the drain electrode can be well formed, the problem of wire breakage in the active layer at the channel between the source/drain electrodes in the structure of the thin film transistor, which is invoked because the source/drain electrode and the insulation layer include the a step therebetween and are not located at the same interface so that the film thickness of the source/drain electrode and the insulation layer can not be controlled easily in forming of the active layer, can be avoided, the performance and stability of the thin film transistor can be improved, and the production costs can be lowered down.

Figure 2:
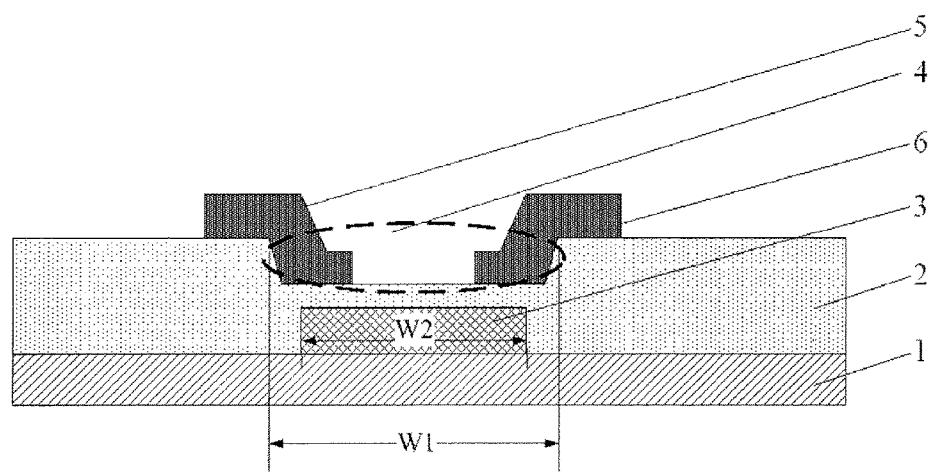
FIG. 2 is a schematic structure view showing another thin film transistor provided by an embodiment of the present invention.

In one embodiment, as shown in FIG. 2, the thin film transistor further includes a source electrode 5 and a drain electrode 6, a portion of the pattern for the source electrode 5 as well as the drain electrode 6 is formed on the gate insulation layer 2 at a position corresponding to the recess 4 on the gate insulation layer 2.

For example, the source electrode and the drain electrode may be formed of a metal such as Au, Ag, Mo, Al, Cu, or the like, a metal oxide material such as ITO or the like, a conductive high molecule material, or the like. For example, the source/drain electrode may have a thickness ranged from 60 to 300 nm.

Figure 3:
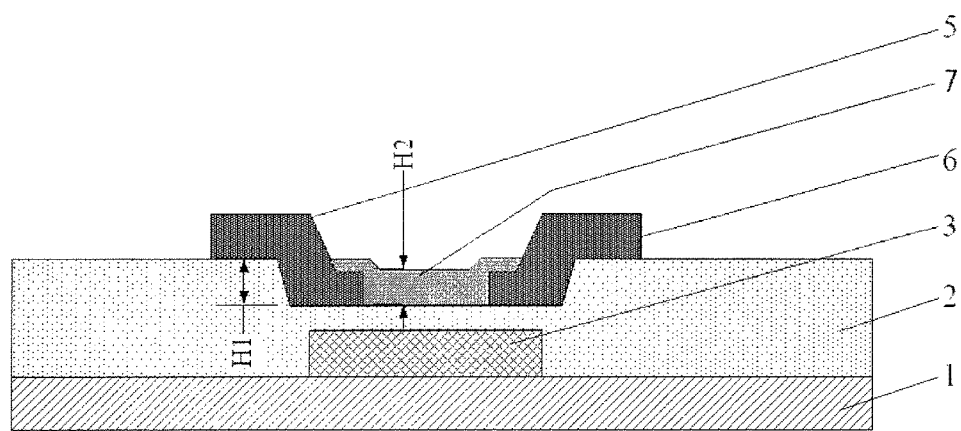
FIG. 3 is a schematic structure view showing still another thin film transistor provided by an embodiment of the present invention.

In at least one embodiment, as shown in FIG. 3, the thin film transistor further includes an active layer formed on the gate insulation layer 2 at a position corresponding to the recess 4 on the gate insulation layer 2.

In at least one embodiment, the material for the active layer can be an organic semiconductor material.

For example, in the embodiment of the present invention, the active layer can be made by using a solution method, and the material for making the active layer can be an organic material prepared by the solution method. Generally, the active layer may have a thickness ranged from 40 to 200 nm, and preferred 40 to 100 nm in the embodiment of the present invention. In the embodiment of the present invention, the active layer can be made on the gate insulation layer at the position corresponding to the recess on the gate insulation layer by a solution spin coating method.

In at least one embodiment, the recess 4 on the gate insulation layer has a width W1 larger than or equal with the width W2 of the gate electrode 3.

In at least one embodiment, the recess 4 on the gate insulation layer has a height H1 larger than or equal with the thickness H2 of the active layer 7.

If the width of the recess on the gate insulation layer is larger than or equal with the width of the gate electrode, and the height of the recess is larger than or equal with the thickness of the active layer, it can be guaranteed that a portion of the pattern for the source electrode as well as the drain electrode can be located at the position corresponding to the recess on the gate insulation layer when the source electrode and the drain electrode are formed subsequently, and the active layer can entirely be formed at the position corresponding to the recess, whereby it is helpful to flow the material for forming the source electrode and the drain electrode into the recess during manufacturing process, and thus it is favorable to form the source electrode and the drain electrode. Also, since the active layer is provided in the recess, when the material for the active layer is coated, the film thickness can be well controlled, the problem of wire breakage can be avoided from occurring on the active layer, the function of active layer for conducting the source/drain electrode can be guaranteed, waste of the raw material can be effectively avoided, and the production costs can be lowered down.

In addition, the thin film transistor provided by the embodiment of the present invention may include a protection layer provided on the source electrode, the drain electrode and the active layer, and coated on the entire substrate, the protection may have a thickness ranged from 1000 Å to 6000 Å, and its material generally is silicon nitride or transparent organic resin material.

In the thin film transistor provided by the embodiment of the present invention, a recess is provided at the position corresponding to the gate electrode on the gate insulation layer of the thin film transistor of the display device, and therefore an active layer can be provided at a position corresponding to the recess on the gate insulation layer, by which the active layer, the source electrode and the drain electrode can be well formed, the problem of wire breakage in the active layer at the channel between the source/drain electrodes in the structure of the thin film transistor, which is invoked because the source/drain electrode and the insulation layer include the a step therebetween and are not located at the same interface so that the film thickness of the source/drain electrode and the insulation layer can not be controlled easily in forming of the active layer, can be avoided, the performance and stability of the thin film transistor can be improved, and the production cost can be lowered down.

At least one embodiment of the present invention provides an array substrate including any one of the thin film transistor provided by the embodiments shown in FIG. 1 to FIG. 3, and the thin film transistor may be a gate bottom contact type thin film transistor.

The array substrate provided by the embodiment of the present invention may also include a plurality of gate lines and a plurality of data lines, the gate lines and the data lines are intersected to define pixel units arranged in an array, each of the pixel units includes the thin film transistor according to the embodiments of the present invention as a switch member. For example, the array substrate may be used as the array substrate in an organic light-emitting diode (OLED), an electronic paper, or a liquid crystal display (LCD).

In the array substrate provided by the embodiment of the present invention, a recess is provided at the position corresponding to the gate electrode on the gate insulation layer of the thin film transistor of the display device, an active layer can be provided at a position corresponding to the recess on the gate insulation layer, by which the active layer, the source electrode and the drain electrode can be well formed, the problem of wire breakage in the active layer at the channel between the source/drain electrodes in the structure of the thin film transistor, which is invoked because the source/drain electrode and the insulation layer include the a step therebetween and are not located at the same interface so that the film thickness of the source/drain electrode and the insulation layer can not be controlled easily in forming of the active layer, can be avoided, the performance and stability of the thin film transistor can be improved, and the production cost can be lowered down.

At least one embodiment of the present invention provides a display device including the array substrate or the thin film transistor provided by the above embodiments of the present invention, the display device may be a liquid crystal panel, an OLED panel, an electronic paper, a mobile phone, a table computer, a television, a laptop computer, a digital photo frame, a navigator or any product or component having display function.

In the display device provided by the embodiment of the present invention, a recess is provided at the position corresponding to the gate electrode on the gate insulation layer of the thin film transistor of the display device, an active layer can be provided at a position corresponding to the recess on the gate insulation layer, by which the active layer, the source electrode and the drain electrode can be well formed, the problem of wire breakage in the active layer at the channel between the source/drain electrodes in the structure of the thin film transistor, which is invoked because the source/drain electrode and the insulation layer include the a step therebetween and are not located at the same interface so that the film thickness of the source/drain electrode and the insulation layer can not be controlled easily in forming of the active layer, can be avoided, the performance and stability of the thin film transistor can be improved, and the production cost can be lowered down.

Figure 4:
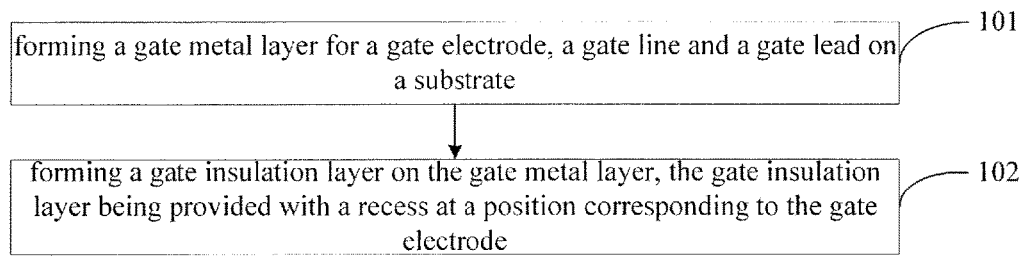
FIG. 4 is a schematic flowchart view showing a manufacturing method for a thin film transistor provided by an embodiment of the present invention.

At least one embodiment of the present invention provides a manufacturing method for a thin film transistor, the thin film transistor may be a gate bottom contact type thin film transistor, as shown in FIG. 4, and the method includes the following step 101 and step 102, which will be described below.

Step 101, forming a gate metal layer for a gate electrode, a gate line and a gate lead on a substrate.

For example, a layer of metal film with a thickness of 1000 Å to 7000 Å is deposited on the substrate (e.g., a glass substrate or a quartz substrate) by magnetron sputtering, generally, the metal film can be a metal film formed by any one of Mo, Al, Al—Ni alloy, Mo—W alloy, Cr, Cu, or the like, or the combination thereof. Then, with the patterning process including exposure, development, etching, peeling off, and so on in connection with a mask plate, the gate metal layer is formed on a certain area of the substrate.

Step 102, forming a gate insulation layer on the gate metal layer, wherein the gate insulation layer is provided with a recess at a position corresponding to the gate electrode.

For example, a gate insulation layer film with a thickness of 1000 Å to 6000 Å is deposited on the glass substrate by chemical vapor deposition method or magnetron sputtering method, the material for the gate insulation layer film is generally silicon nitride, and silicon oxide, silicon oxynitride, and so on, in the embodiment of the present invention, a photosensitive organic material is preferred. By using the mask plate, the gate insulation layer is exposed to UV light above the gate electrode, so that a recess shape is formed at the position corresponding to the gate electrode.

In at least one embodiment, the manufacturing method further includes forming a portion of a pattern for a source electrode and a drain electrode at a position on the gate insulation layer corresponding the recess on the gate insulation layer.

In at least one embodiment, the manufacturing method further includes forming a layer of active layer on the gate insulation layer at a position corresponding to the recess on the gate insulation layer. For example, the material for the active layer may be an organic semiconductor material.

The sequence for forming the source/drain electrode and the active layer is not limited in the embodiments of the present invention.

Figure 5:
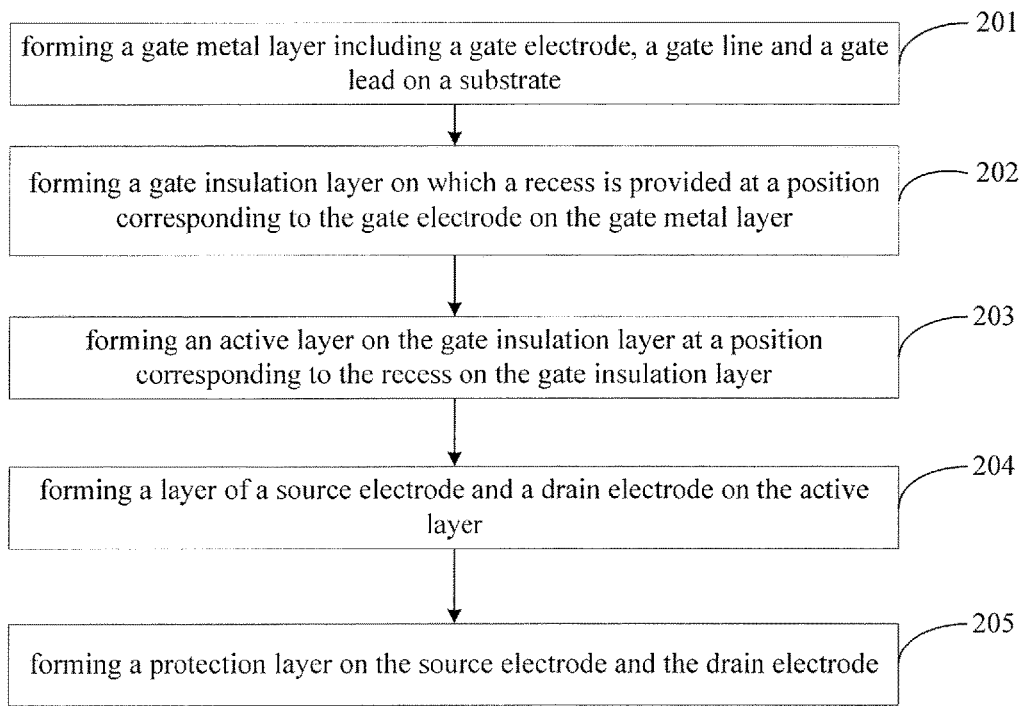
FIG. 5 is a schematic flowchart view showing a manufacturing method for another thin film transistor provided by an embodiment of the present invention.

For example, when the active layer is formed before the source electrode and the drain electrode, as shown in FIG. 5, the method may include the following steps 201 to 205.

Step 201, forming a gate metal layer including a gate electrode, a gate line and a gate lead on a substrate.

Step 202, forming a gate insulation layer on which a recess is provided at a position corresponding to the gate electrode on the gate metal layer.

Step 203, forming a layer of active layer on the gate insulation layer at a position corresponding to the recess on the gate insulation layer.

For example, a metal oxide semiconductor film can be deposited on the gate insulation layer by chemical vapor deposition method, and then the metal oxide semiconductor film is processed in one patterning process, the active layer is formed; that is, after photoresist is applied, the substrate is subjected to exposure, development, and etching in connection with an ordinary mask plate, to form the active layer.

Step 204, forming a layer of a source electrode and a drain electrode on the active layer.

In this step, a portion of a pattern for the source electrode and the drain electrode is formed on the gate insulation layer at a position corresponding to the recess on the gate insulation layer.

By using the method similar to that for forming the gate line, a metal film with a thickness of 1000 Å to 7000 Å is deposited on the substrate, similar to the gate metal layer. With a patterning process, the source electrode and the drain electrode are formed in a certain area, and the finally formed source electrode and drain electrode have a thickness of 600 Å to 3000 Å.

Step 205, forming a layer of protection layer on the source electrode and the drain electrode.

For example, by using the method similar to that for forming the gate insulation layer and the active layer, a protection layer with a thickness of 1000 Å to 6000 Å is formed on the entire substrate, generally, the material for the protection layer is silicon nitride or transparent organic resin material.

It is to be noted that the description to the steps in the flowchart of the present embodiment which are identical with the steps in the above embodiment is omitted.

Figure 6:
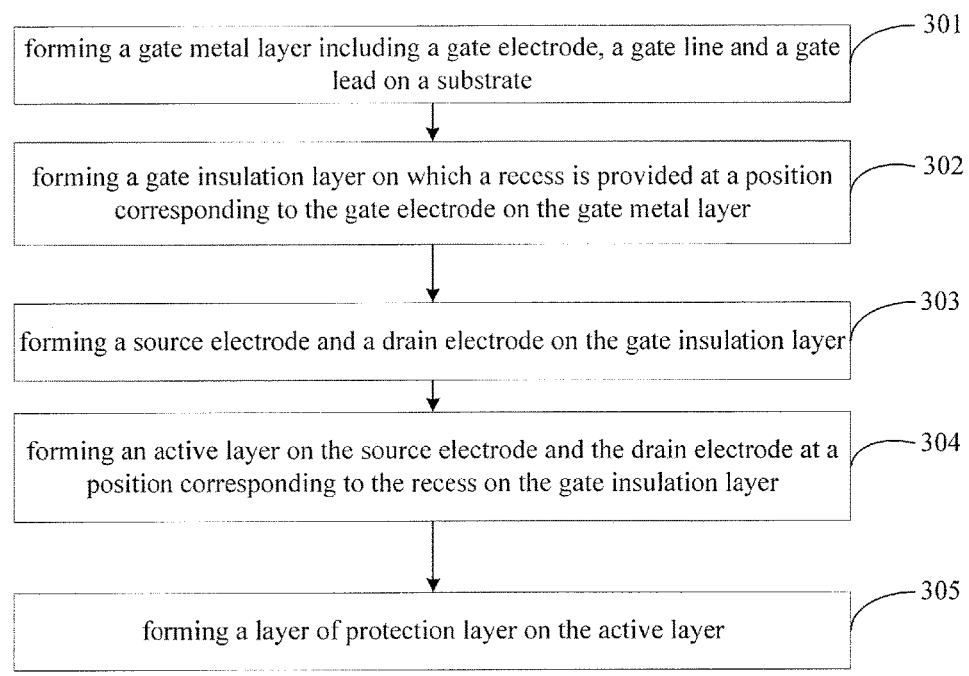
FIG. 6 is a schematic flowchart view showing a manufacturing method for still another thin film transistor provided by an embodiment of the present invention.

For example, when the active layer is formed after the source electrode and the drain electrode, referring to FIG. 6, the method includes the following steps 301 to 305.

Step 301, forming a gate metal layer including a gate electrode, a gate line and a gate lead on a substrate.

Step 302, forming a gate insulation layer on which a recess is provided at a position corresponding to the gate electrode on the gate metal layer.

Step 303, forming a source electrode and a drain electrode on the gate insulation layer.

In this step, a portion of a pattern for the source electrode and the drain electrode is formed on the gate insulation layer at a position corresponding to the recess on the gate insulation layer.

For example, the source electrode and the drain electrode can be formed by coating a layer of negative photoresist on the gate insulation layer, forming a pattern for the source/drain electrode area by a mask plate, then depositing a layer of metal film on the gate insulation layer by vacuum sputtering method, and finally performing a lifting-off process for the negative photoresist.

Step 304, forming an active layer on the source electrode and the drain electrode at a position corresponding to the recess on the gate insulation layer.

For example, the active layer can be formed by coating organic semiconductor material by a solution method.

Step 305, forming a layer of protection layer on the active layer.

It is noted that the description to the steps in the flowchart of the present embodiment which are identical with the steps in the above embodiment is omitted.

In the manufacturing method for the thin film transistor provided by the embodiments of the present invention, a recess is provided on the gate insulation layer at the position corresponding to the gate electrode when making the thin film transistor, the active layer may be provided at the position corresponding to the recess on the gate insulation layer, by which the active layer, the source electrode and the drain electrode can be well formed, the problem of wire breakage in the active layer, which is invoked because the source/drain electrode and the insulation layer have a step therebetween and are not located at the same one interface in the structure of the thin film transistor and the film thickness of the source/drain electrode and the insulation layer can not be easily controlled in forming the active layer finally, can be avoided, the performance and stability of the thin film transistor can be improved, the production cost can be lowered down, and thus the production efficiency can be improved.

The present disclosure has been described above by way of the exemplary embodiment, and the protection scope of the present disclosure would not be limited therein, and is only defined by the following claims.

The present application claims the priority of Chinese Patent Application No. 201410360841.3 filed on Jul. 25, 2014, the Chinese Patent Application is entirely incorporated by reference therein as a part of the present application.

What is claimed is:

1. A thin film transistor, of a gate bottom contact type, comprising a substrate, a gate electrode, an active layer, a pattern for a source electrode and a drain electrode, and a gate insulation layer,
    wherein the gate insulation layer is provided with a recess at a position corresponding to the gate electrode;
    wherein the active layer overlaps on the source electrode and the drain electrode to form overlapping regions, the overlapping regions are all located in the recess of the gate insulating layer, and the active layer is symmetrical along an axis that extends perpendicular to a top surface of the substrate.

2. The thin film transistor according to claim 1, wherein a portion of the pattern for the source electrode and the drain electrode is located on the gate insulation layer at a position corresponding to the recess on the gate insulation layer.

3. The thin film transistor according to claim 1, wherein a material for the active layer is an organic semiconductor material.

4. An array substrate comprising the thin film transistor according to claim 1.

5. A display device comprising the array substrate according to claim 4.

6. The thin film transistor according to claim 1, wherein a portion of the pattern for the source electrode and the drain electrode is in contact with an inner wall of the recess.

7. The thin film transistor according to claim 6, wherein the active layer is formed on the gate insulation layer at a position corresponding to the recess on the gate insulation layer.

8. The thin film transistor according to claim 6, wherein the recess on the gate insulation layer has a width larger than or equal with a width of the gate electrode.

9. The thin film transistor according to claim 6, wherein the recess on the gate insulation layer has a height larger than or equal with a thickness of the active layer.

10. The thin film transistor according to claim 1, wherein a thickness of the source electrode is from 60 nm to 300 nm, a thickness of the gate electrode is from 60 nm to 300 nm, and a thickness of the active layer is from 40 nm to 200 nm.

11. A manufacturing method for a thin film transistor, comprising:
    providing a substrate;
    forming a gate metal layer including a gate electrode on the substrate; and
    forming a gate insulation layer on the gate metal layer, wherein the gate insulation layer is provided with a recess at a position corresponding to the gate electrode;
    forming a pattern for a source electrode and a drain electrode and an active layer on the gate insulation layer;
    wherein the active layer overlaps on the source electrode and the drain electrode to form overlapping regions, the overlapping regions are all located in the recess of the gate insulating layer, and the active layer is symmetrical along an axis that extends perpendicular to a top surface of the substrate.

12. The method according to claim 11, wherein a portion of the pattern for the source electrode and the drain electrode on the gate insulation layer is formed on the gate insulation layer at a position corresponding to the recess on the gate insulation layer.

13. The method according to claim 11, wherein:
    a material for the active layer is an organic semiconductor material.

14. The thin film transistor according to claim 1, wherein the active layer is formed on the gate insulation layer at a position corresponding to the recess on the gate insulation layer.

15. The thin film transistor according to claim 1, wherein the recess on the gate insulation layer has a width larger than or equal with a width of the gate electrode.

16. The thin film transistor according to claim 1, wherein the recess on the gate insulation layer has a height larger than or equal with a thickness of the active layer.

17. The method according to claim 11, wherein a portion of the pattern for the source electrode and the drain electrode is in contact with an inner wall of the recess.

18. The method according to claim 11, wherein the active layer is formed on the gate insulation layer at a position corresponding to the recess on the gate insulation layer.

19. The method according to claim 11, wherein the recess on the gate insulation layer has a width larger than or equal with a width of the gate electrode.

20. The method according to claim 11, wherein the recess on the gate insulation layer has a height larger than or equal with a thickness of the active layer.

* * * * *